United States Patent
Kitajima

(10) Patent No.: US 9,538,644 B2
(45) Date of Patent: Jan. 3, 2017

(54) MULTILAYER WIRING SUBSTRATE AND MODULE INCLUDING SAME

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 295 days.

(21) Appl. No.: 14/246,266

(22) Filed: Apr. 7, 2014

(65) Prior Publication Data

US 2014/0305686 A1 Oct. 16, 2014

(30) Foreign Application Priority Data

Apr. 15, 2013 (JP) ................................. 2013-084566

(51) Int. Cl.
*H05K 1/02* (2006.01)
*H05K 3/46* (2006.01)
*H05K 3/34* (2006.01)

(52) U.S. Cl.
CPC ... *H05K 1/0298* (2013.01); *H01L 2224/16225* (2013.01); *H01L 2924/15174* (2013.01); *H05K 3/341* (2013.01); *H05K 3/4629* (2013.01); *H05K 2201/0352* (2013.01); *H05K 2201/09045* (2013.01); *H05K 2201/09672* (2013.01)

(58) Field of Classification Search
CPC ................... H05K 1/111; H05K 1/141–1/148; H05K 1/181; H05K 1/182; H05K 1/188; H05K 3/341

See application file for complete search history.

(56) References Cited

U.S. PATENT DOCUMENTS

| 2001/0054481 A1* | 12/2001 | Harada | .................. B32B 38/10 156/289 |
| 2003/0002260 A1* | 1/2003 | Hasebe | ................. H01L 23/142 361/720 |
| 2003/0011074 A1* | 1/2003 | Jung | ................. H01L 23/49838 257/773 |
| 2003/0047801 A1* | 3/2003 | Azuma | ............... H01L 21/4853 257/700 |

(Continued)

FOREIGN PATENT DOCUMENTS

| JP | 2001-185851 A | 7/2001 |
| JP | 2002-110717 A | 4/2002 |

(Continued)

OTHER PUBLICATIONS

Official Communication issued in corresponding Japanese Patent Application No. 2013-084566, mailed on Mar. 3, 2015.

*Primary Examiner* — Jeremy C Norris
*Assistant Examiner* — Muhammed Azam
(74) *Attorney, Agent, or Firm* — Keating & Bennett, LLP

(57) ABSTRACT

A multilayer wiring substrate includes a multilayer body in which a plurality of insulating layers is stacked and to which an electronic component is mounted, a plurality of connection terminals disposed on one principal surface of the multilayer body for connection to the electronic component, and a plurality of rear electrodes disposed on the other principal surface of the multilayer body, wherein the connection terminals are each arranged in overlapped relation to one of the rear electrodes when looked at in a plan view of the multilayer wiring substrate.

17 Claims, 5 Drawing Sheets

(56) References Cited

U.S. PATENT DOCUMENTS

| | | | | |
|---|---|---|---|---|
| 2003/0079909 A1* | 5/2003 | Nguyen | ............... | H01L 25/105 |
| | | | | 174/260 |
| 2004/0007376 A1* | 1/2004 | Urdahl | ................ | H05K 1/0209 |
| | | | | 174/534 |
| 2005/0017375 A1* | 1/2005 | Ko | ................... | H01L 23/49816 |
| | | | | 257/782 |
| 2005/0087747 A1* | 4/2005 | Yamada | .................. | G02B 6/43 |
| | | | | 257/80 |
| 2005/0167803 A1* | 8/2005 | Imamura | ............ | G02F 1/13452 |
| | | | | 257/678 |
| 2007/0103257 A1* | 5/2007 | Murata | ................... | H05K 1/16 |
| | | | | 333/185 |
| 2007/0151757 A1* | 7/2007 | Fujikawa | ............... | H05K 1/111 |
| | | | | 174/261 |
| 2008/0179740 A1* | 7/2008 | Liao | ................. | H01L 23/49816 |
| | | | | 257/738 |
| 2008/0236882 A1* | 10/2008 | Ono | ................. | H01L 23/49816 |
| | | | | 174/267 |
| 2008/0303144 A1* | 12/2008 | Kasai | ...................... | H01L 22/24 |
| | | | | 257/737 |
| 2009/0056987 A1* | 3/2009 | Nomiya | ............. | H01L 21/4857 |
| | | | | 174/255 |

FOREIGN PATENT DOCUMENTS

| | | |
|---|---|---|
| JP | 2003-78251 A | 3/2003 |
| JP | 2011-119722 A | 6/2011 |
| WO | 2010/143471 A1 | 12/2010 |

* cited by examiner

MULTILAYER WIRING SUBSTRATE AND MODULE INCLUDING SAME

BACKGROUND OF THE INVENTION

1. Field of the Invention

The present invention relates to a multilayer wiring substrate that is formed by pressing and firing a plurality of insulating layers, and to a module including the multilayer wiring substrate.

2. Description of the Related Art

There is known so far, as illustrated in FIG. 5, a high-frequency switch module 100 including a high-frequency switch 102 that is flip-chip mounted to one principal surface of a multilayer substrate 101 (See, for example, International Publication WO2010-143471, especially paragraphs [0030]-[0032] and FIG. 4). In the high-frequency switch module 100, the multilayer substrate 101 is a ceramic multilayer substrate in which a dielectric ceramic and a wiring electrode 103 are alternately stacked. A plurality of mount electrodes 104 connected to various terminals of the high-frequency switch 102 is formed on one principal surface (upper surface) of the multilayer substrate 101, and a plurality of outer electrodes 105 connected to electrodes of one or more external circuit substrates is formed on the other principal surface (lower surface) of the multilayer substrate 101. Furthermore, a plurality of via conductors 106 for connecting the mount electrodes 104 and the wiring electrodes 103 and for connecting the wiring electrodes 103 and the outer electrodes 105 are disposed inside the multilayer substrate 101.

In general, a ceramic multilayer substrate is manufactured as follows. First, slurry containing mixed powder of, e.g., alumina and glass, together with an organic binder and a solvent mixed additionally thereto, is formed into sheets, thus preparing a plurality of ceramic green sheets. In each of the ceramic green sheets, via holes are formed at predetermined positions by laser processing, for example, and a conductive paste containing, e.g., Ag or Cu, is filled into the via holes, thus forming via conductors for interlayer connection. Furthermore, various electrode patterns are formed by printing the conductive paste. The multilayer ceramic substrate is then obtained by stacking the ceramic green sheets, and by pressing and firing a stacked multilayer body under a predetermined pressure at a predetermined temperature.

When the multilayer substrate 101 of the high-frequency switch module 100 of the related art is formed in accordance with the above-described method, the following problem may arise in some cases. Portions of the one principal surface of the multilayer substrate 101, which are overlapped with the outer electrodes 105 when looked at in a plan view of the multilayer substrate 101, are raised corresponding to thicknesses of the outer electrodes 105. Accordingly, a level difference (step difference) in a stacking direction of the multilayer body may occur in the one principal surface between the portions overlapping with the outer electrodes 105 formed on the other principal surface and other portions not overlapping with the outer electrodes 105.

In such a situation, when the high-frequency switch 102 is flip-chip mounted to a region of the one principal surface where the portion including the above-mentioned level difference is present, there is a possibility of a mounting failure that, due to a level difference between the mount electrodes 104 formed in the above-mentioned region, a failure of solder wetting may occur between some of the mount electrodes 104 and a corresponding terminal of the high-frequency switch 102, or the high-frequency switch 102 may tilt and displace from a proper position.

SUMMARY OF THE INVENTION

In view of the problems described above, preferred embodiments of the present invention improve mounting performance of electronic components onto a multilayer wiring substrate that is manufactured through pressing and firing.

According to a preferred embodiment of the present invention, a multilayer wiring substrate includes a multilayer body in which a plurality of insulating layers is stacked and to which an electronic component is mounted, a plurality of connection terminals disposed on one principal surface of the multilayer body for connection to the electronic component, and a plurality of rear electrodes disposed on the other principal surface of the multilayer body, wherein the connection terminals are each arranged in overlapped relation to one of the rear electrodes when looked at in a plan view of the multilayer wiring substrate.

Thus, since the connection terminals for connection to the electronic component are each arranged in overlapped relation to one of the rear electrodes when looked at in the plan view, the connection terminals are all positioned in regions of the one principal surface, which are raised with the presence of the rear electrodes, even when a level difference (step difference) occurs in or on the one principal surface upon pressing of the multilayer body. Accordingly, the connection terminals are not positioned separately in both a higher level region and a lower level region, which are provided on the one principal surface of the multilayer body due to the level difference, and the heights of the connection terminals are kept even. As a result, a risk of a mounting failure of the electronic component is significantly reduced, the mounting failure being attributable to the arrangement that the connection terminals are present separately in both the higher level region and the lower level region, which are provided on the one principal surface of the multilayer body due to the above-mentioned level difference.

The multilayer wiring substrate may further include an in-plane conductor disposed inside the multilayer body in at least one of the insulating layers, and a thickness of each of the rear electrodes may be greater than a thickness of the in-plane conductor.

In the case of utilizing the rear electrodes as electrodes for connection to the outside, if the thicknesses of the rear electrodes are reduced, connection strength with respect to the outside may degrade in some cases. However, by forming the rear electrodes in thicknesses greater than that of the in-plane conductor, the connection strength of the multilayer wiring substrate with respect to the outside is increased in comparison with that when the thickness of the rear electrodes are smaller than that of the in-plane conductor. Furthermore, when the thicknesses of the rear electrodes are increased, amounts by which the regions in the one principal surface of the multilayer body overlapping with the rear electrodes when looked at in the plan view are raised (i.e., the heights of those regions in the stacking direction) are increased correspondingly. This raises the above-mentioned risk of the mounting failure of the electronic component. However, since the connection terminals are each arranged in overlapped relation to one of the rear electrodes when looked at in the plan view, the risk of the mounting failure of the electronic component is significantly reduced while the connection strength with respect to the outside is significantly increased.

The in-plane conductor may be arranged in overlapped relation to all the connection terminals when looked at in the plan view. Such an arrangement significantly reduces or prevents a variation in the amounts by which the regions in the one principal surface overlapping with the rear electrodes when looked at in the plan view are raised upon pressing of the multilayer body. Hence the mounting performance of the electronic component is further improved. Furthermore, when the in-plane conductor defines a ground electrode and the electronic component is mounted to the multilayer wiring substrate, the ground electrode is positioned just under the electronic component. Hence the lengths of wiring electrodes are significantly reduced. Accordingly, parasitic inductances are reduced, such that reliability of grounding is greatly enhanced and spurious characteristics are improved. In addition, isolation characteristics of the electronic component are improved due to the presence of the ground electrode.

The in-plane conductor may be disposed in plural in two or more of the insulating layers, two or more of the plural in-plane conductors may include regions each overlapping with at least one of the connection terminals when looked at in the plan view, and wiring densities in a stacking direction of the insulating layers in the regions of the in-plane conductors overlapping with the connection terminals preferably are the same or substantially the same.

When a heat shrinkage rate is different between the in-plane conductor and the insulating layers (multilayer body), a variation in the wiring density of the in-plane conductors when viewed in the stacking direction appears as a variation in the thickness of the multilayer body, thus reducing flatness of the one principal surface of the multilayer body. Taking into account such a reduction in the flatness, the wiring densities in the stacking direction preferably are set to be equal or substantially equal to each other in the respective regions of the in-plane conductors overlapping with the connection terminals such that the thickness of the multilayer body preferably is the same or substantially the same in respective portions of the multilayer body where the connection terminals are arranged. As a result, the heights of the connection terminals are reliably kept even, and the mounting performance of the electronic component is further improved.

The rear electrode arranged at a position overlapping with the connection terminal when looked at in the plan view may be a ground electrode or a dummy electrode, the dummy electrode being not connected to any other electrodes. In such a case, the ground electrode is preferably provided as the rear electrode that is arranged at the position overlapping with the connection terminal. Moreover, when the dummy electrode is disposed, another rear electrode (e.g., a rear electrode for inputting and outputting signals) is no longer needed to be arranged at the position overlapping with the relevant connection terminal. As a result, a degree of freedom in layout of the wiring structure in the multilayer wiring substrate is significantly increased.

The connection terminals may be all arranged at positions overlapping with one of the rear electrodes when looked at in the plan view. Such an arrangement is practically advantageous in that, since the connection terminals are all arranged in overlapped relation to the one rear electrode when looked at in the plan view, the one rear electrode having a relatively large area like, e.g., a ground electrode when looked at in the plan view, it is no longer required to arrange individual rear electrodes corresponding to the connection terminals, respectively. In the case of arranging the ground electrode just under the electronic component, the length of a wiring electrode connecting a ground terminal of the electronic component and the ground electrode to each other is significantly reduced. Accordingly, a parasitic inductance is greatly reduced and spurious characteristics are improved. In addition, isolation characteristics of the electronic component are improved.

The connection terminals may be disposed such that the electronic component is mounted in plural to the one principal surface. Even when plural electronic components are mounted to the multilayer wiring substrate, the mounting performance of the electronic components is significantly improved with the above-mentioned arrangement.

According to another preferred embodiment of the present invention, a module includes the above-described multilayer wiring substrate, wherein a plurality of outer terminals of the electronic component is disposed corresponding to two or more of the connection terminals of the multilayer body in the multilayer wiring substrate, and the outer terminals of the electronic component are directly connected to the corresponding connection terminals. A module with higher mounting performance of the electronic component is thus provided, for example, by including the above-described multilayer wiring substrate in a module in which the outer terminals of the electronic component are directly connected to the connection terminals of the multilayer wiring substrate, as in a flip-chip mounted module.

The module may further include another electronic component mounted to a region on the one principal surface of the multilayer body, which region is not overlapped with any of the rear electrodes when looked at in the plan view, the other electronic component having a height greater than a height of the aforementioned electronic component in the stacking direction. As described above, the region on the one principal surface of the multilayer body, which region is not overlapped with any of the rear electrodes when looked at in the plan view, has a lower height in the stacking direction than the region overlapping with any of the rear electrodes when looked at in the plan view. Therefore, the height of the module is significantly reduced by mounting the other electronic component, which has the height in the stacking direction greater than that of the aforementioned electronic component connected to the connection terminals, in the lower level region on the one principal surface of the multilayer body.

Thus, according to the preferred embodiments of the present invention, the multilayer wiring substrate includes the multilayer body in which the plural insulating layers are stacked and to which the electronic component is mounted, the plural connection terminals disposed on one principal surface of the multilayer body for connection to the electronic component, and the plural rear electrodes disposed on the other principal surface of the multilayer body, wherein the connection terminals are each arranged in overlapped relation to one of the rear electrodes when looked at in a plan view of the multilayer wiring substrate. With these features, the connection terminals are not positioned separately in both the higher level region and the lower level region on the one principal surface of the multilayer body, and the heights of the connection terminals are kept even. As a result, the risk of the mounting failure of the electronic component is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
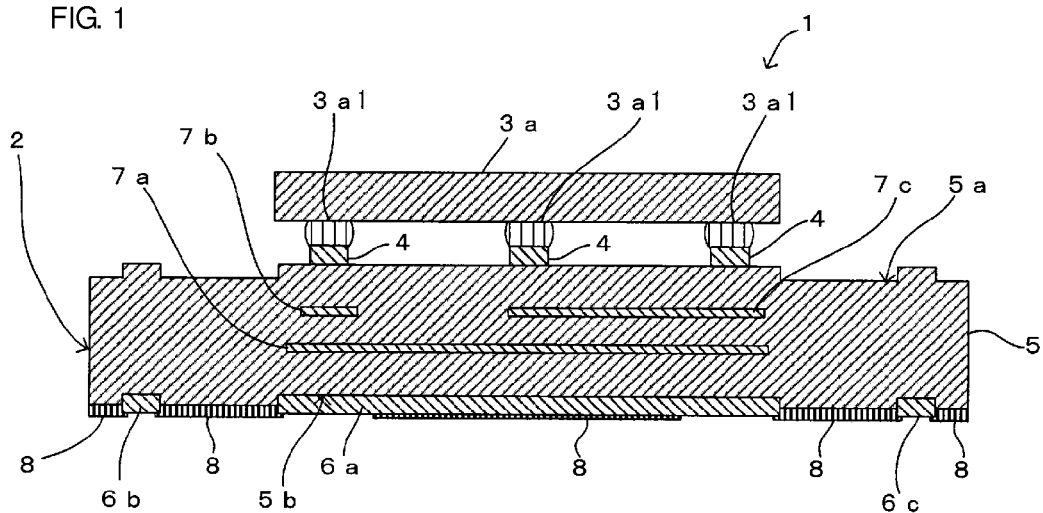
FIG. 1 is a sectional view of a module according to a first preferred embodiment of the present invention.

A module 1 according to a first preferred embodiment of the present invention will be described below with reference to FIG. 1. FIG. 1 is a sectional view of the module 1 according to the first preferred embodiment.

As illustrated in FIG. 1, the module 1 according to this preferred embodiment includes a multilayer wiring substrate 2 and an electronic component 3a. The module 1 is connected to an external circuit substrate.

The electronic component 3a is, e.g., a semiconductor element made of Si, GaAs, or the like. The electronic component 3a includes, on its circuit forming surface, a plurality of outer terminals 3a1 each corresponding any of connection terminals 4 of a multilayer body 5. The outer terminals 3a1 are directly connected to the corresponding connection terminals 4 of the multilayer wiring substrate 2 preferably by flip-chip mounting, for example. The electronic component 3a may be a chip component, e.g., a chip capacitor or a chip inductor.

The multilayer wiring substrate 2 includes the multilayer body 5 that includes a stack of a plurality of insulating layers made of an insulating material, e.g., a ceramic, the connection terminals 4 disposed on one principal surface 5a of the multilayer body 5 for connection to the electronic component 3a, a plurality of rear electrodes 6a to 6c disposed on the other principal surface 5b of the multilayer body 5, and a plurality of in-plane conductors 7a to 7c disposed inside the multilayer body 5. Via conductors (not illustrated) to interconnect corresponding ones of the connection terminals 4, the rear electrodes 6a to 6c, and the in-plane conductors 7a to 7c between different layers are also formed inside the multilayer body 5.

The rear electrode 6a is a ground electrode preferably having a planar or substantially planar shape. The rear electrode 6a preferably has a size (e.g., an area taken in a plan view of the multilayer wiring substrate 2) that overlaps with all the connection terminals 4 on the one principal surface 5a of the multilayer body 5 when looked at in the plan view. The rear electrodes 6b and 6c are electrodes through which signals are input and output between the multilayer wiring substrate 2 and the external circuit substrate, for example. For the purpose of increasing connection strength with respect to the external circuit substrate, the rear electrodes 6a to 6c are preferably thicker than the in-plane conductors 7a to 7c. Onto the other principal surface 5b of the multilayer body 5, a framing 8 is applied with a ceramic paste or a solder resist, for example, to prevent the rear electrodes 6a to 6c from peeling off from the multilayer body 5, or to adjust respective areas of the rear electrodes 6a to 6c such that, when the multilayer wiring substrate 2 is connected to the external circuit substrate, a proper connection area is obtained in match with an area of a corresponding electrode of the external circuit substrate.

Furthermore, a plurality of in-plane conductors each made of a metallic material, such as Cu or Al, is provided on the insulating layers. As illustrated in FIG. 1, for example, of the plural in-plane conductors, two in-plane conductors 7b and 7c are both preferably provided on the same insulating layer, and another in-plane conductor 7a different from those two in-plane conductors 7b and 7c is provided on the insulating layer different from the one on which the in-plane conductors 7b and 7c are provided.

In the present preferred embodiment, the in-plane conductors 7a to 7c are configured and arranged such that each in-plane conductor has a region overlapping with at least one of the connection terminals 4 when looked at in the plan view, and that wiring densities in the stacking direction are equal to each other in the respective regions of the in-plane conductors 7a to 7c overlapping with the connection terminals 4. More specifically, when looked at in the plan view, the connection terminal 4 on the left side of the drawing sheet is overlapped with the in-plane conductors 7a and 7b, the connection terminal 4 on the right side of the drawing sheet is overlapped with the in-plane conductors 7a and 7c, and the connection terminal 4 at the center of the drawing sheet is overlapped with the in-plane conductors 7a and 7c. Thus, respective wiring densities in the stacking direction just under those connection terminals 4 preferably are the same. In this preferred embodiment, the in-plane conductor 7a preferably is a planar ground electrode overlapping with all the connection terminals 4 when looked at in the plan view, and the in-plane conductor 7a is connected to a ground terminal of the electronic component 3a through the via conductors, etc. in the multilayer body 5. It is to be noted that the rear electrode 6a is not always required to be a ground electrode. The rear electrode 6a may be, e.g., a dummy electrode that is not connected to any other electrodes provided in the multilayer body 5.

The multilayer wiring substrate 2 having the above-described structure is manufactured, for example, as follows. First, slurry containing mixed powder of, e.g., alumina and glass, together with an organic binder and a solvent mixed additionally thereto, is formed into sheets, thus preparing a plurality of ceramic green sheets (insulating layers). In each of the ceramic green sheets, via holes are formed at predetermined positions by laser processing, for example, and a conductive paste containing, e.g., Ag or Cu, is filled into the via holes, thus forming via conductors for interlayer connection. Furthermore, the various in-plane conductors 7a to 7c are formed by printing the conductive paste. The multilayer wiring substrate 2 is then obtained by stacking the ceramic green sheets, and by pressing and firing a stacked body, i.e., the multilayer body 5, under a predetermined pressure at a predetermined temperature.

In the multilayer wiring substrate 2 manufactured through the pressing and the firing as described above, as illustrated in FIG. 1, regions in the one principal surface 5a of the multilayer body 5, which are overlapped with the rear electrodes 6a to 6c when looked at in the plan view, are raised corresponding to thicknesses of the rear electrodes 6a to 6c. Accordingly, a level difference (step difference) in a stacking direction of the multilayer body 5 occurs in the one principal surface 5a of the multilayer body 5 between the regions overlapping with the rear electrodes 6a to 6c when looked at in the plan view and other regions not overlapping with the rear electrodes 6a to 6c. Taking into account the above level difference, in this preferred embodiment, the connection terminals 4 for connection to the electronic component 3a preferably are all arranged in a region overlapping with the rear electrode 6a, when looked at in the plan view, such that the connection terminals 4 are not positioned separately at different levels, i.e., in both a higher level region and a lower level region on the one principal surface 5a of the multilayer body 5. It is to be noted that, in FIG. 1, the raised regions in the one principal surface 5a of the multilayer body 5 are illustrated in a slightly exaggerated manner.

According to the above-described preferred embodiment, therefore, since the connection terminals 4 for connection to the electronic component 3a are all arranged in overlapped relation to the rear electrode 6a when looked at in the plan view, the connection terminals 4 are all positioned in the region of the one principal surface 5a, which region is raised with the presence of the rear electrode 6a, even when the level difference (step difference) occurs in the one principal surface 5a upon the pressing of the multilayer body 5. Thus, the connection terminals 4 are not positioned separately at different levels, i.e., in both the higher level region and the lower level region on the one principal surface 5a of the multilayer body 5, and the heights of the connection terminals 4 are kept even. As a result, a risk of a mounting failure of the electronic component 3a is significantly reduced.

Furthermore, since the ground electrode in the form of the in-plane conductor 7a and the ground electrode in the form of the rear electrode 6a are arranged just under the electronic component 3a, it is possible to shorten the lengths of interconnection conductors between ground terminals (outer terminal 3a1) of the electronic component 3a and the ground electrodes disposed in the multilayer body 5, such as the length of an interconnection conductor between the ground terminal of the electronic component 3a and the ground electrode formed as the in-plane conductor 7a, and the length of an interconnection conductor between the ground terminal of the electronic component 3a and the ground electrode formed as the rear electrode 6a. As a result, parasitic inductances of the ground electrodes is significantly reduced, and spurious characteristics are improved. Isolation characteristics of the electronic component 3a are also improved due to the presence of the two ground electrodes.

When a heat shrinkage rate is different between the in-plane conductors 7a to 7c and the insulating layers (multilayer body 5), a variation in the wiring density of the in-plane conductors 7a to 7c inside the multilayer body 5 when viewed in the stacking direction appears as a variation in the thickness of the multilayer body 5, thus reducing flatness of the one principal surface 5a of the multilayer body 5. Taking into account such a reduction in the flatness, in this preferred embodiment, the wiring densities in the stacking direction preferably are set to be equal or substantially equal to each other in the respective regions of the in-plane conductors 7a to 7c overlapping with the connection terminals 4 when looked at in a plan view of the multilayer body 5 such that the thickness of the multilayer body 5 is the same or substantially the same in respective portions of the multilayer body 5 where the connection terminals 4 are arranged. As a result, the heights of the connection terminals 4 are reliably kept even, and the mounting performance of the electronic component 3a is further improved.

When the thicknesses of the rear electrodes 6a to 6c are reduced, the connection strength with respect to the external circuit substrate may degrade in some cases. In this preferred embodiment, since the rear electrodes 6a to 6c preferably have thicknesses greater than those of the in-plane conductors 7a to 7c, the connection strength of the multilayer wiring substrate 2 with respect to the external circuit substrate is increased in comparison with that when the thicknesses of the rear electrodes 6a to 6c are smaller than those of the in-plane conductors 7a to 7c. Furthermore, when the thicknesses of the rear electrodes 6a to 6c are increased, amounts by which the regions in the one principal surface 5a of the multilayer body 5 overlapping with the rear electrodes 6a to 6c when looked at in the plan view are raised (i.e., the heights of those regions in the stacking direction) are increased correspondingly. This raises the risk of the mounting failure of the electronic component 3a. In this preferred embodiment, however, since the connection terminals 4 preferably are all arranged in overlapped relation to the rear electrode 6a when looked at in the plan view, the risk of the mounting failure of the electronic component 3a is significantly reduced while the connection strength with respect to the external circuit substrate is greatly increased.

Moreover, since the in-plane conductors 7a to 7c preferably are arranged in overlapped relation to all the connection terminals 4 when looked at in the plan view, it is possible to significantly reduce or prevent a variation in the amounts by which the regions in the one principal surface 5a of the multilayer body 5 overlapping with the rear electrodes 6a to 6c when looked at in the plan view are raised upon the pressing of the multilayer body 5. Hence, the mounting performance of the electronic component 3a is further improved.

In addition, the module 1 with the less risk of the mounting failure of the electronic component 3a is advantageously provided by including the multilayer wiring substrate 2 having the high mounting performance.

Second Preferred Embodiment

Figure 2:
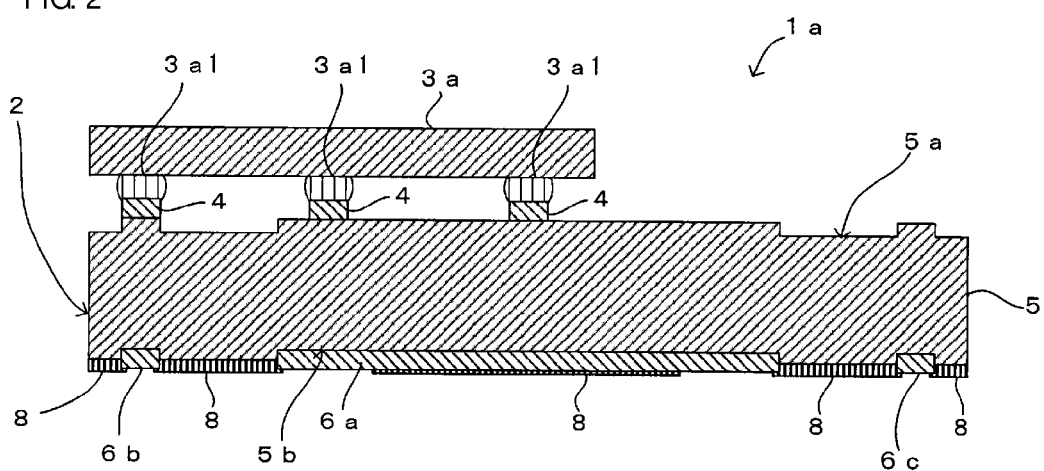
FIG. 2 is a sectional view of a module according to a second preferred embodiment of the present invention.

A module 1a according to a second preferred embodiment of the present invention will be described below with reference to FIG. 2. FIG. 2 is a sectional view of the module 1a. It is to be noted that, in FIG. 2, the in-plane conductors 7a to 7c disposed inside the multilayer body 5 preferably are omitted.

The module 1a according to the second preferred embodiment is different from the module 1 according to the first preferred embodiment, described above with reference to FIG. 1, in that a rear electrode overlapping with the connection terminals 4 when looked at in a plan view of the module is configured by a plurality of rear electrodes 6a and 6b, as illustrated in FIG. 2. Because the other structure is preferably the same or substantially the same as that in the first preferred embodiment, corresponding constituent elements are denoted by the same reference signs and description of those constituent elements is omitted.

In the second preferred embodiment, of the connection terminals 4, the connection terminal 4 on the left side of the drawing sheet is overlapped with the rear electrode 6b when looked at in the plan view, and the remaining two connection terminals 4 are overlapped with the rear electrode 6a. The outer terminals 3a1 of the electronic component 3a are directly connected to the corresponding connection terminals 4 of the multilayer body 5 by flip-chip mounting, respectively.

With the arrangement described above, the connection terminals 4 are arranged in a state straddling a region on the one principal surface 5a of the multilayer body 5 where there is a level difference in the stacking direction. However, since the connection terminals 4 preferably are all arranged at positions overlapping with the rear electrodes 6a and 6b when looked at in the plan view, the level difference in the stacking direction does not occur among the connection terminals 4, and the heights of the connection terminals 4 can be kept even. Accordingly, even when the connection terminals 4 are arranged in the state straddling the region on the one principal surface 5a of the multilayer body 5 where there is a level difference in the stacking direction, the risk of the mounting failure of the electronic component 3a is significantly reduced. Furthermore, since all the connection terminals 4 are not needed to be arranged at positions overlapping with the one planar rear electrode 6a when looked at in the plan view, a degree of freedom in layout of the connection terminals 4 is greatly increased.

Moreover, when the connection terminals 4 are arranged in the state straddling the region on the one principal surface 5a of the multilayer body 5 where there is a level difference in the stacking direction, this arrangement causes a portion having a relatively large gap between the circuit defining surface of the electronic component 3a and the one principal surface 5a of the multilayer body 5 (i.e., a lower level region that is provided on the one principal surface 5a of the multilayer body 5 due to the above-described level difference). In such a case, for example, when resin is filled into a connecting portion between the electronic component 3a and the multilayer body 5, the resin tends to more easily flow into the portion having the relatively large gap, and filling performance of the resin increases. With the increase in the filling performance of the resin, reliability of connection between the electronic component 3a and the multilayer wiring substrate 2 (multilayer body 5) is greatly increased. In addition, it is possible to prevent the so-called solder splash, i.e., the problem that when a solder connecting the outer terminals 3a1 of the electronic component 3a and the connection terminals 4 of the multilayer body 5 is re-melted, the adjacent connection terminals 4 are short-circuited by the re-melted solder.

Third Preferred Embodiment

Figure 3:
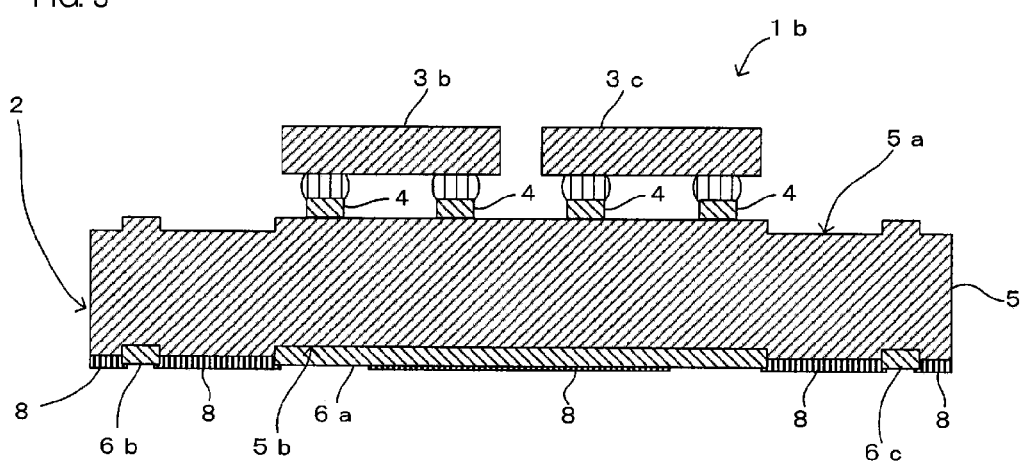
FIG. 3 is a sectional view of a module according to a third preferred embodiment of the present invention.

A module 1b according to a third preferred embodiment of the present invention will be described below with reference to FIG. 3. FIG. 3 is a sectional view of the module 1b. It is to be noted that, in FIG. 3, the in-plane conductors 7a to 7c disposed inside the multilayer body 5 are preferably omitted.

The module 1b according to the third preferred embodiment is different from the module 1 according to the first preferred embodiment, described above with reference to FIG. 1, in that a plurality (for example, preferably two in the third preferred embodiment) of electronic components 3b and 3c are mounted to the multilayer wiring substrate 2, as illustrated in FIG. 3. Because the other structure is preferably the same or substantially the same as that in the first preferred embodiment, corresponding constituent elements are denoted by the same reference signs and description of those constituent elements is omitted.

In the third preferred embodiment, the connection terminals 4 corresponding to both the electronic components 3b and 3c preferably are all arranged in overlapped relation to the one rear electrode 6a when looked at in a plan view of the module, and the electronic components 3b and 3c are flip-chip mounted to the one principal surface 5a of the multilayer body 5.

With the arrangement described above, even when the plural electronic components 3b and 3c are mounted to the multilayer body 5, the risk of the mounting failure is significantly reduced for all the electronic components 3b and 3c. It is to be noted that all the connection terminals 4 are not needed to be arranged in overlapped relation to the one rear electrode 6a when looked at in the plan view. As another example, the rear electrode overlapping with the connection terminals 4 when looked at in the plan view may be constituted by the plural rear electrode 6a and 6b as in the second preferred embodiment, for example.

Fourth Preferred Embodiment

Figure 4:
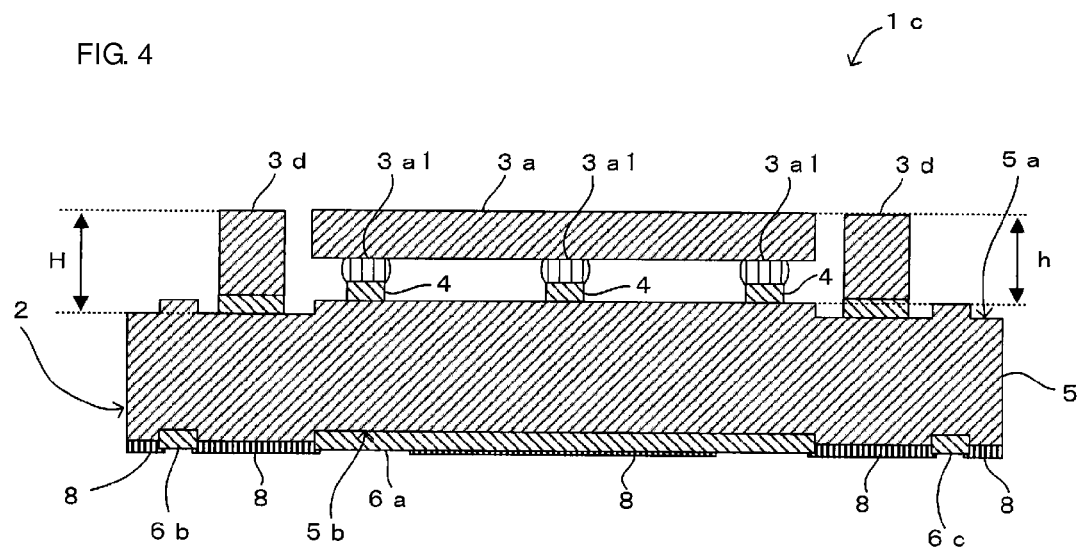
FIG. 4 is a sectional view of a module according to a fourth preferred embodiment of the present invention.
Figure 5:
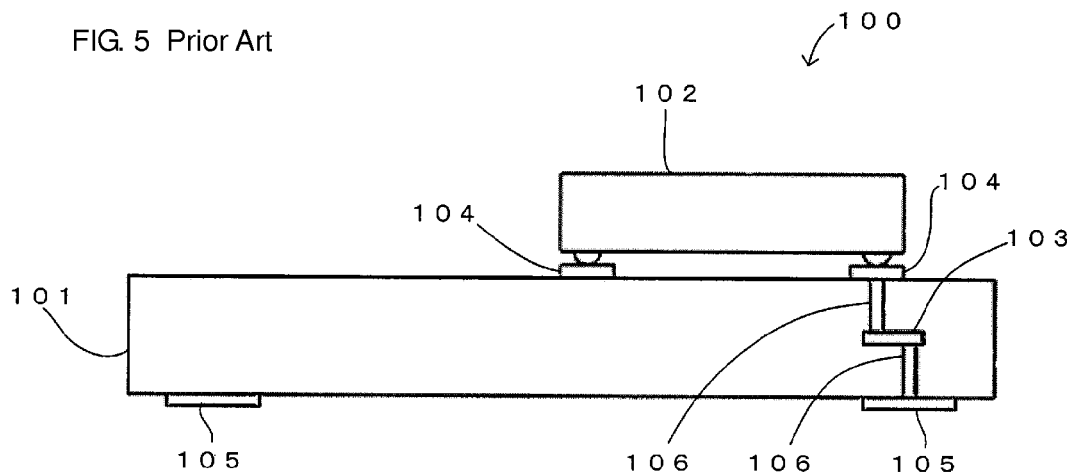
FIG. 5 is a sectional view of a high-frequency switch module of related art.

A module 1c according to a fourth preferred embodiment of the present invention will be described below with reference to FIG. 4. FIG. 4 is a sectional view of the module 1c. It is to be noted that, in FIG. 4, the in-plane conductors 7a to 7c disposed inside the multilayer body 5 are preferably omitted.

The module 1c according to the fourth preferred embodiment is different from the module 1 according to the first preferred embodiment, described above with reference to FIG. 1, in further including other electronic components 3d each mounted to a region on the one principal surface 5a of the multilayer body 5, which is not overlapped with any of the rear electrodes 6a to 6c when looked at in a plan view of the module, and each having a height H that is greater than a height h of the electronic component 3a in the stacking direction (i.e., H>h), as illustrated in FIG. 4. Because the other structure is preferably the same or substantially the same as that in the first preferred embodiment, corresponding constituent elements are denoted by the same reference signs and description of those constituent elements is omitted.

In the fourth preferred embodiment, the other electronic components 3d having a height greater than that of the electronic component 3a are each mounted to the region on the one principal surface 5a of the multilayer body 5, which is not overlapped with any of the rear electrodes 6a to 6c when looked at in the plan view, i.e., to a lower level region on the one principal surface 5a of the multilayer body 5 due to the above-described level difference, whereas the electronic component 3a is mounted to a higher level region on the one principal surface 5a of the multilayer body 5 due to the above-described level difference. The other electronic component 3d may be a suitable one of active components, such as a semiconductor element, and passive components, such as a chip capacitor, for example.

As described above, when the multilayer wiring substrate 2 is formed through the pressing, the level difference occurs in the one principal surface 5a of the multilayer body 5. However, the height of the entire module 1c is reliably reduced by, as in the fourth preferred embodiment, utilizing the lower level region formed due to the level difference, and by mounting, to the lower level region, the other electronic component 3d having the height in the stacking direction greater than that of the electronic component 3a.

The present invention is not limited to the above-described preferred embodiments, and the present invention can be modified in various ways other than described above without departing from the gist of the present invention.

For instance, while the preferred embodiments have been described in connection with an example in which the insulating layers of the multilayer body 5 are each preferably made of ceramic, the insulating layer may be made of, e.g., resin such as a glass epoxy resin.

In the above-described preferred embodiments, the modules 1 and 1a to 1c may include underfill resin that fills gaps between the electronic components 3a to 3d and the one principal surface 5a of the multilayer body 5, and/or mold resin covering the electronic components 3a to 3d.

Preferred embodiments of the present invention can be applied to not only various types of multilayer wiring substrates each including a plurality of stacked insulating layers, but also to various types of modules including those multilayer wiring substrates, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring substrate comprising:
   a multilayer body in which a plurality of insulating layers is stacked and to which an electronic component is mounted;
   a plurality of connection terminals disposed on one principal surface of the multilayer body for connection to the electronic component;
   a plurality of rear electrodes disposed on another principal surface of the multilayer body; and
   an in-plane conductor disposed inside the multilayer body on at least one of the insulating layers; wherein
   the connection terminals are each arranged in overlapped relation to one of the rear electrodes when looked at in a plan view of the multilayer wiring substrate; and
   a thickness of each of the rear electrodes is greater than a thickness of the in-plane conductor.

2. A module comprising the multilayer wiring substrate according to claim 1, wherein
   a plurality of outer terminals of the electronic component is disposed corresponding to two or more of the connection terminals of the multilayer body in the multilayer wiring substrate; and
   the outer terminals of the electronic component are directly connected to the corresponding connection terminals.

3. The multilayer wiring substrate according to claim 1, wherein the in-plane conductor is arranged in overlapped relation to all the connection terminals when looked at in the plan view.

4. The multilayer wiring substrate according to claim 1, wherein
   the in-plane conductor is disposed plural in at least two of the insulating layers;
   at least two of the plural in-plane conductors include regions each overlapping with at least one of the connection terminals when looked at in the plan view; and
   wiring densities in a stacking direction of the insulating layers in the regions of the in-plane conductors overlapping with the connection terminals are the same or substantially same.

5. The multilayer wiring substrate according to claim 1, wherein the rear electrode arranged at a position overlapping with the connection terminal when looked at in the plan view is a ground electrode or a dummy electrode, the dummy electrode being not connected to any other electrodes.

6. The multilayer wiring substrate according to claim 1, wherein the connection terminals are all arranged at positions overlapping with one of the rear electrodes when looked at in the plan view.

7. The multilayer wiring substrate according to claim 1, wherein the connection terminals are disposed such that the electronic component is mounted in plural to the one principal surface.

8. The multilayer wiring substrate according to claim 1, wherein the electronic component is one of a semiconductor element, a chip component, a chip capacitor, and a chip inductor.

9. The multilayer wiring substrate according to claim 5, wherein the rear electrode that defines the ground electrode has a planar or substantially planar shape.

10. The multilayer wiring substrate according to claim 5, wherein the rear electrode that defines the ground electrode overlaps all the connection terminals when looked at in the plan view.

11. The multilayer wiring substrate according to claim 1, further comprising a framing configured to the rear electrodes from peeling off of the multilayer body.

12. The multilayer wiring substrate according to claim 1, further comprising a plurality of in-plane conductors provided in the multilayer body such that at least two of the plurality of in-plane conductors is provided on a same one of the plurality of insulating layers.

13. The multilayer wiring substrate according to claim 1, wherein the plurality of in-plane conductors overlap with respective ones of the plurality of connection terminals when looked at in the plan view.

14. The multilayer wiring substrate according to claim 1, wherein the plurality of in-plane conductors are defined by ground conductors.

15. The multilayer wiring substrate according to claim 1, wherein one of the plurality of rear electrodes overlaps at least two of the plurality of connection terminals when looked at in the plan view.

16. The multilayer wiring substrate according to claim 1, wherein the plurality of connection terminals are arranged in a state straddling a region on the one principal surface of the multilayer body where there is a level difference in a stacking direction.

17. The module according to claim 2, further comprising another electronic component mounted to a region on the one principal surface of the multilayer body that is not overlapped with any of the rear electrodes when looked at in the plan view, the other electronic component having a height greater than a height of the electronic component in a stacking direction.

* * * * *